United States Patent
Bickford et al.

(10) Patent No.: US 9,772,374 B2
(45) Date of Patent: Sep. 26, 2017

(54) SELECTIVE VOLTAGE BINNING LEAKAGE SCREEN

(71) Applicant: INTERNATIONAL BUSINESS MACHINES CORPORATION, Armonk, NY (US)

(72) Inventors: Jeanne P. Bickford, Essex Junction, VT (US); Kevin K. Dezfulian, Mount Kisco, NY (US); Susan K. Lichtensteiger, Essex Junction, VT (US); Jeanne H. Raymond, Richmond, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 1054 days.

(21) Appl. No.: 13/644,264

(22) Filed: Oct. 4, 2012

(65) Prior Publication Data

US 2014/0100799 A1    Apr. 10, 2014

(51) Int. Cl.
*G01R 31/317* (2006.01)
*G01R 31/30* (2006.01)

(52) U.S. Cl.
CPC .... *G01R 31/31718* (2013.01); *G01R 31/3008* (2013.01)

(58) Field of Classification Search
CPC ................ G01R 31/3008; G01R 31/31718
USPC .......................................................... 702/60
See application file for complete search history.

(56) References Cited

U.S. PATENT DOCUMENTS

| | | | |
|---|---|---|---|
| 6,694,492 | B1 | 2/2004 | Shakkarwar |
| 7,363,176 | B2 | 4/2008 | Patel et al. |
| 7,379,836 | B2 * | 5/2008 | Schoenborn ....... G01R 31/3008 324/750.02 |
| 7,475,366 | B2 | 1/2009 | Kuemerle et al. |
| 7,532,003 | B1 | 5/2009 | Greenhill et al. |
| 7,577,859 | B2 | 8/2009 | Bilak |
| 7,810,054 | B2 | 10/2010 | Anemikos et al. |
| 7,877,714 | B2 | 1/2011 | Anemikos et al. |
| 7,917,451 | B2 | 3/2011 | Barnett et al. |
| 8,020,138 | B2 | 9/2011 | Balch et al. |

(Continued)

OTHER PUBLICATIONS

Steinbrueck, G. et al., "Non-Contact, Pad-less Measurement Technology and Test Structures for Characterization of Cross-Wafer & In-Die Process-induced Variability", tau-Metrix, IEEE 2009 ICMTS Conference, 2009, pp. 1-26.

(Continued)

*Primary Examiner* — Mohamed Charioui
*Assistant Examiner* — Catherine Rastovski
(74) *Attorney, Agent, or Firm* — Steven Meyers; Andrew M. Calderon; Roberts Mlotkowski Safran Cole & Calderon, P.C.

(57) ABSTRACT

Methods and structures for leakage screening are disclosed. A method includes sorting devices manufactured from the same device design into voltage bins corresponding to a respective supply voltage. The method further includes determining a respective total power of each of the voltage bins. The method further includes determining a respective uplift power of the voltage bins. The method further includes determining a respective first leakage screen value for each of the voltage bins based on the respective uplift power of each of the voltage bins.

20 Claims, 7 Drawing Sheets

(56) References Cited

U.S. PATENT DOCUMENTS

| | | |
|---|---|---|
| 2007/0255516 A1 | 11/2007 | Patel et al. |
| 2008/0034337 A1 | 2/2008 | Kuemerle et al. |
| 2009/0210201 A1 | 8/2009 | Bickford et al. |
| 2009/0228843 A1* | 9/2009 | Anemikos ........... G06F 17/5045 716/132 |
| 2009/0295402 A1 | 12/2009 | Balch et al. |
| 2011/0106497 A1 | 5/2011 | Visweswariah et al. |

OTHER PUBLICATIONS

Zolotov, V. et al., "Voltage Binning Under Process Variation" ICCAD, 2009, 8 pages.

Paul, S. et al., "Low-Overhead Fmax Calibration at Multiple Operating Points Using Delay-Sesitivity-Based Path Selection", ACM Transactions on Design Automation of Electronic Systems, vol. 15, No. 2, Article 19, Feb. 3, 2010, 34 pages.

* cited by examiner

SELECTIVE VOLTAGE BINNING LEAKAGE SCREEN

FIELD OF THE INVENTION

The present invention generally relates to power consumption of integrated circuits and more particularly, selective voltage binning of integrated circuits.

BACKGROUND

Power consumption of integrated circuit devices (e.g., complementary metal oxide semiconductors (CMOS)) consists of two components: dynamic power (i.e., active power) and leakage power (i.e., static power). Dynamic power is the power required to switch the state of a device (i.e., to change the binary state of one or more device components from high to low or low to high). It is a function of capacitance, voltage, and switching frequency (e.g., $P \sim CV^nF$, where P is the dynamic power, C is the effective switch capacitance, V is the supply voltage, n is a coefficient greater than or equal to 2, and F is the switching frequency). Leakage power is the power consumed by a device when it is powered but not switching. In an integrated circuit device composed primarily of metal oxide semiconductor field effect transistors, the leakage power is an exponential function of the supply voltage.

Manufacturing processes may vary one or more physical parameters of devices that are formed according to the same design. These variations can affect delay (i.e., performance) of devices. Devices having delays that are extremely fast or slow with respect to an average one of the devices may not be desirable. In more technical terms, such devices may be at the "slow" end or the "fast" end of a process-voltage-temperature (PVT) space. A device at the "slow" end of the PVT space may not meet device delay requirements, whereas a device manufactured at the "fast" end of the PVT space may consume excessive dynamic power and/or leakage.

Selective voltage binning is a method for sorting manufactured devices to reduce the worst-case power consumption of a distribution of devices (e.g., parts). This technique varies the supply voltage based on the respective device delay of the devices in each voltage bin. Specifically, slower devices require a higher voltage to operate at maximum delay and faster devices require a lower voltage to operate within maximum power requirements. Therefore, slower devices are assigned to bins having greater voltage and faster devices are assigned to bins having lower voltage. This increases the fraction of the manufacturing distribution which simultaneously meet the design requirements for device delay and power consumption.

In selective voltage binning, testing is performed to determine the respective device delays of individual devices manufactured from the same design. For example, the temperature and voltage of the device may be fixed and the device delay of one or more components of the device may be measured. The devices are sorted into a plurality of voltage bins (i.e., groups) based on their respective device delays. If the delay of a particular device is low then the device is placed in a fast voltage bin corresponding to its delay. If the delay is high, then the device is placed in a slow device voltage bin corresponding to its delay. After the devices are sorted into bins, the range of acceptable supply voltages for operating the devices in each voltage bin is determined. In general, the nominal supply voltage for each bin decreases monotonically from the slowest bin to the fastest bin. Since both dynamic power and leakage power increase in proportion to the supply voltage, a reduction in the required supply voltage will reduce both dynamic and leakage power consumption and, thus, total power consumption.

When a particular device is provided to a customer, it is provided along with information indicating one or both of its assigned voltage bin and the required supply voltage corresponding to its assigned voltage bin. For example, the assigned bin or supply voltage requirements may be recorded within or on a device (e.g., by using a printed barcode or embedded non-volatile memory devices) for reference by a customer when setting up power supplies in a system using a particular device.

BRIEF SUMMARY

In an aspect of the invention, a method comprises sorting a plurality of devices manufactured from the same device design into a plurality of voltage bins corresponding to a respective supply voltage. The method further comprises determining a respective total power of each of the plurality of voltage bins. The method further comprises determining a respective uplift power of each of the plurality of voltage bins. The method further comprises determining a respective first leakage screen value for each of the plurality of voltage bins based on the respective uplift power of each of the plurality of voltage bins.

In another aspect of the invention, a method for performing leakage screening comprises sorting a plurality of devices manufactured from the same device design into a plurality of voltage bins corresponding to a respective supply voltage. The method further comprises determining a respective first leakage screen value for each of a plurality of voltage bins. The method further comprises determining a second leakage screen value for a fastest performance voltage bin of the plurality of voltage bins. The method further comprises selecting one of the respective first leakage screen value and the second leakage screen value for each of the plurality of voltage bins.

In an additional aspect of the invention, a computer program product comprising a computer readable storage medium having readable program code embodied in the storage medium is provided. The computer program product includes at least one component configured to determine a respective first leakage screen value for each of a plurality of voltage bins, said first leakage screen value providing a guard band with respect to a respective expected (e.g. median) leakage current for each of a plurality of voltage bins. The at least one component is further configured to determine a second leakage screen value for a fastest performance voltage bin of the plurality of bins. The at least one component is further configured to select one of the respective first leakage screen value and the second leakage screen value for each of the plurality of voltage bins.

BRIEF DESCRIPTION OF THE SEVERAL VIEWS OF THE DRAWINGS

The present invention is described in the detailed description that follows, in reference to the noted plurality of drawings by way of non-limiting examples of exemplary embodiments of the present invention.

DETAILED DESCRIPTION

The present invention generally relates to power consumption of integrated circuits and, more particularly, to selective voltage binning for integrated circuits. According to aspects of the invention, respective leakage screen values (also referred to herein as a "leakage screen") are determined for each of a plurality of voltage bins such that the maximum power for a particular voltage bin does not exceed predefined power constraints. In certain embodiments, the leakage screen value for a particular voltage bin is selected based on a comparison of more than one leakage screen value. A first leakage screen value is determined for each of the voltage bins based on the total power consumed by devices within each voltage bin under device use conditions (i.e., at the respective supply voltage of the particular voltage bin). A second leakage screen value is determined for all the voltage bins based on the total power consumed by devices under device use conditions in the fastest of the voltage bins. By comparing the values of the first and second leakage screen values (e.g., by subtraction) for each of the voltage bins and selecting the lesser value, implementations of the present invention screen out devices that exceed design power constraints.

For example, certain embodiments of the invention determine a first leakage screen value for each of a plurality of voltage bins (enumerated, e.g., as bins 0-15) by uplifting the expected (i.e. typical or average) total power (i.e., leakage power summed with dynamic power) of each voltage bin by a predetermined proportion (e.g., 5%) and determine the respective leakage current in each voltage bin under device test conditions (e.g. fixed temperature and supply voltage). Additionally, a second leakage screen value for each bin is determined based on the expected current leakage, under device test conditions, of the fastest performance voltage bin (e.g., voltage bin 15, which may be the fastest performance voltage bin). In embodiments, this second leakage screen value is the maximum leakage permitted for any of the voltage bins. For each voltage bin, a comparison is performed between the respective first leakage screen value and the second leakage value. The lesser of the two leakage screen values is selected and associated with its respective voltage bin. Accordingly, the total power consumed under device use conditions by devices assigned a particular voltage bin never exceeds the applied power uplift for that voltage bin (e.g., 105% of the expected total power) and, otherwise, is limited by the maximum leakage determined from the fastest performance voltage bin. Notably, most devices will have lower power than the determined leakage screen.

Figure 1:
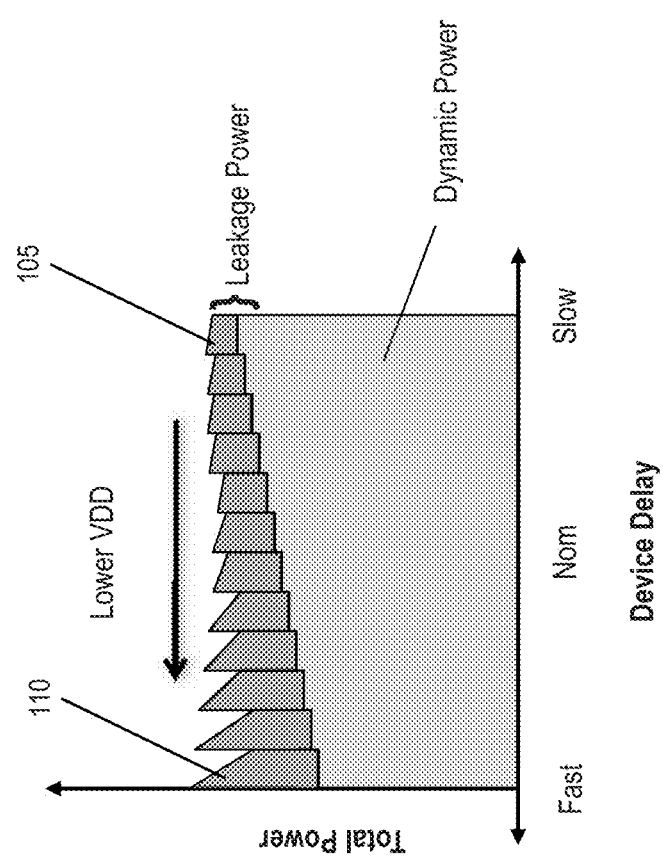
FIG. 1 shows a graph illustrating total power versus device delay, under device use conditions, for an exemplary set of voltage bins.

FIG. 1 shows a graph illustrating total power versus device delay, under device use conditions, for an exemplary set of voltage bins. The total power of each voltage bin is a combination of the dynamic power and the leakage power when operated at the respective supply voltage of the voltage bin. The delay of each voltage bin corresponds to a delay range for devices manufactured according to the same design. Devices that are "slow" have a higher delay with respect to a nominal (i.e., average) one of the devices operating at the same supply voltage. Devices that are "fast" have a lower delay with respect to a nominal one of the devices operating at the same supply voltage. Accordingly, the slowest devices are placed in the voltage bin 105 and the fastest devices are placed in the voltage bin 110. Each of the voltage bins is associated with a corresponding supply voltage determined to improve their respective performance and/or power consumption. That is, slower voltage bins are operated at progressively higher supply voltages to improve their delay; whereas, faster bins are operated at progressively lower supply voltages to reduce their power consumption. Notably, FIG. 1 illustrates twelve voltage bins; however, any number of bins can be used (e.g., 16).

Figure 2:
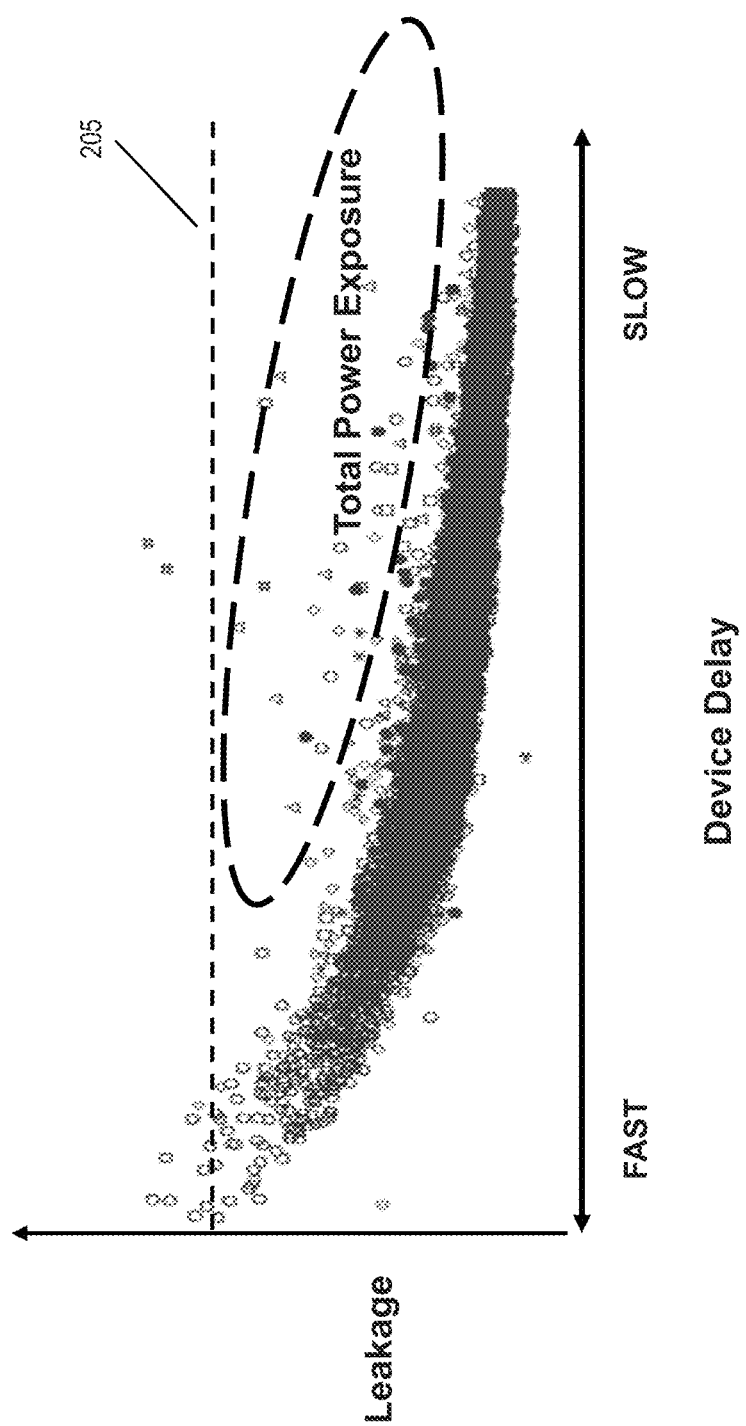
FIG. 2 shows a graph illustrating leakage current, under device test conditions, for a population of devices having various delays and highlighting the power exposure due to exemplary devices having an elevated leakage current at a particular device delay relative to the bulk of the population of devices.

FIG. 2 shows a graph illustrating leakage current for devices of the same design having different delays due to manufacturing variations and highlighting the power exposure due to exemplary devices with elevated leakage at a particular device delay. The power exposure represents the risk that a particular device will cause a device to fail by exceeding design power constraints. As shown in FIG. 2, the power exposure may be limited by screening-out (e.g., discarding) devices that exceed the value of a fixed leakage screen 205 and, therefore, are likely to exceed the design power constraints. The leakage screen value 205 may be determined based on the leakage current of a fastest performance voltage bin, such as voltage bin 110 in FIG. 1. The leakage screen in FIG. 2 can be obtained by using a leakage model to calculate the worst-case leakage for a particular device having a corresponding supply voltage. For example, a worst-case expected leakage current may be determined at the bin with the fastest allowed delay. Any devices determined to operate outside the leakage screen value 205 may be discarded as non-conforming (i.e., operating outside of device power constraints).

Since devices in the fastest performance voltage bin (e.g., voltage bin 110 in FIG. 1) have the greatest leakage current, it may typically be assumed that devices in slower bins have lower leakage current and, therefore, should operate within the leakage screen value 205. However, this assumption is not always correct. As illustrated in FIG. 2, a majority of the data points are grouped in a single band and beneath the leakage screen value 205. However, a number of the data points are above this band in the zone labeled "total power exposure." Many of the devices in this zone are within the leakage screen value 205 and would likely ship to customers. However, due to their high device delays, selective voltage binning would place theses devices in a voltage bin corresponding to a higher supply voltage. Consequently, their relatively high leakage current and supply voltage may result in a total power that exceeds their designed power limits.

As discussed above, selective-voltage-binning (SVB) using the fastest performance process voltage bin to set a maximum leakage screen value 205 can result in a device exceeding power consumption limits for one or more devices under use conditions. In other words, the total power predicted based on the fastest performance process voltage bin may not be valid for all the devices included in each of the voltage bins. Device failures and/or reductions in device production yields may result from exceeding power constraints. Implementations of the invention address this issue by determining a respective leakage screen value for each one of the plurality of voltage bins.

Figure 3:
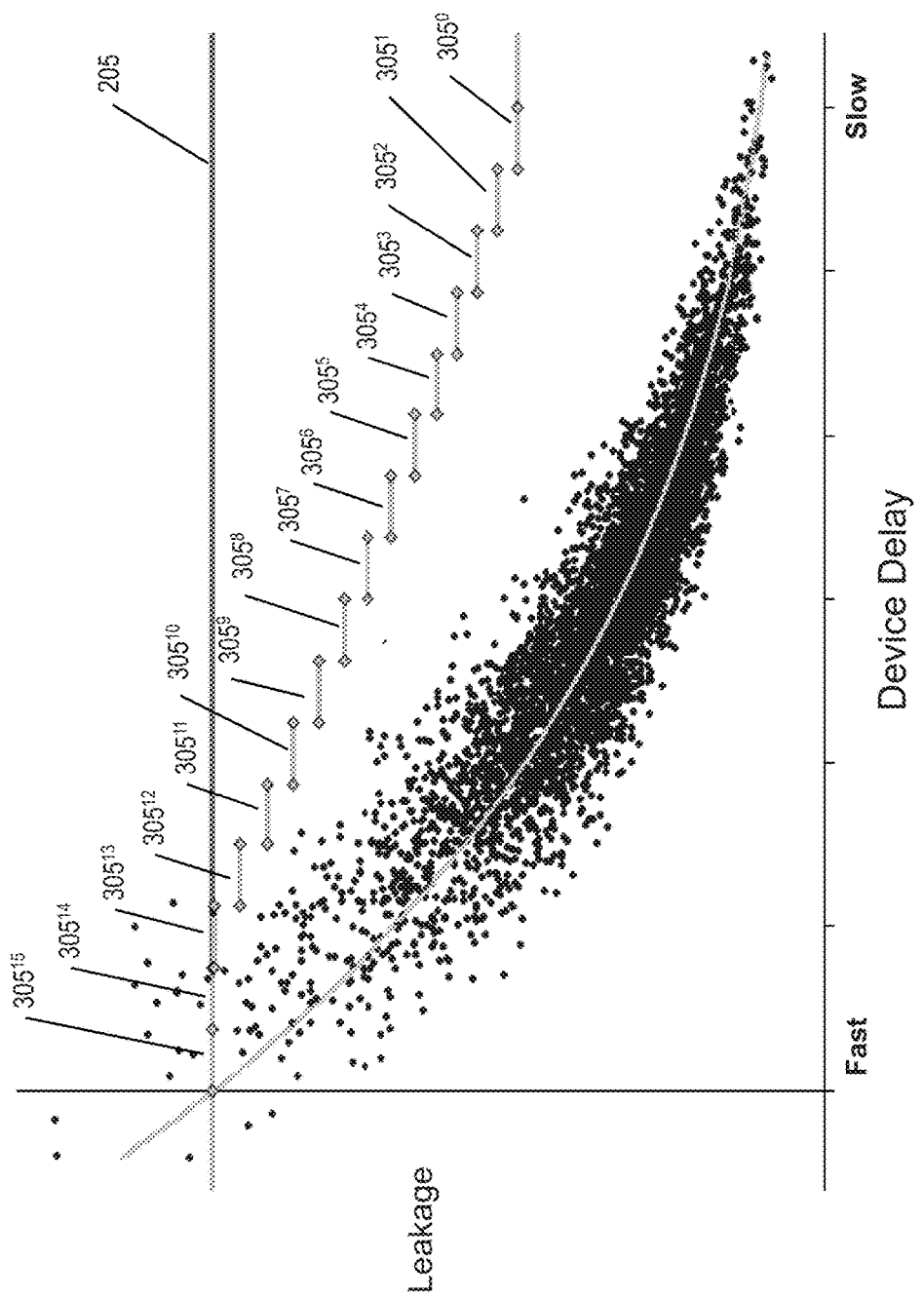
FIG. 3 graph shows a graph illustrating leakage current, under device test conditions, for a population of devices having various delays and respective leakage screen values for exemplary voltage bins in accordance with aspects of the invention.

FIG. 3 shows a graph illustrating leakage current, under device test conditions, for a population of devices having various delays and respective leakage screen values for exemplary voltage bins in accordance with aspects of the invention. That is, each leakage screen value $305^0$ to $305^{15}$ in FIG. 3 corresponds to a respective one of the voltage bins (e.g., 0-15). In addition, FIG. 3 includes a leakage screen value 205, which is similar to that described with respect to FIG. 2.

By comparison with FIG. 2, the leakage screen values $305^0$ to $305^{15}$ limit the power exposure by screening-out devices that would not be screened out by the leakage screen value 205. For example, the leakage screen value $305^5$ would screen out a device in voltage bin 5 that has high leakage current but still falls below the leakage screen value 205. Thus, implementations of the invention further constrain the total power for devices in each voltage bin as compared to a fixed leakage screen 205.

Figure 4:
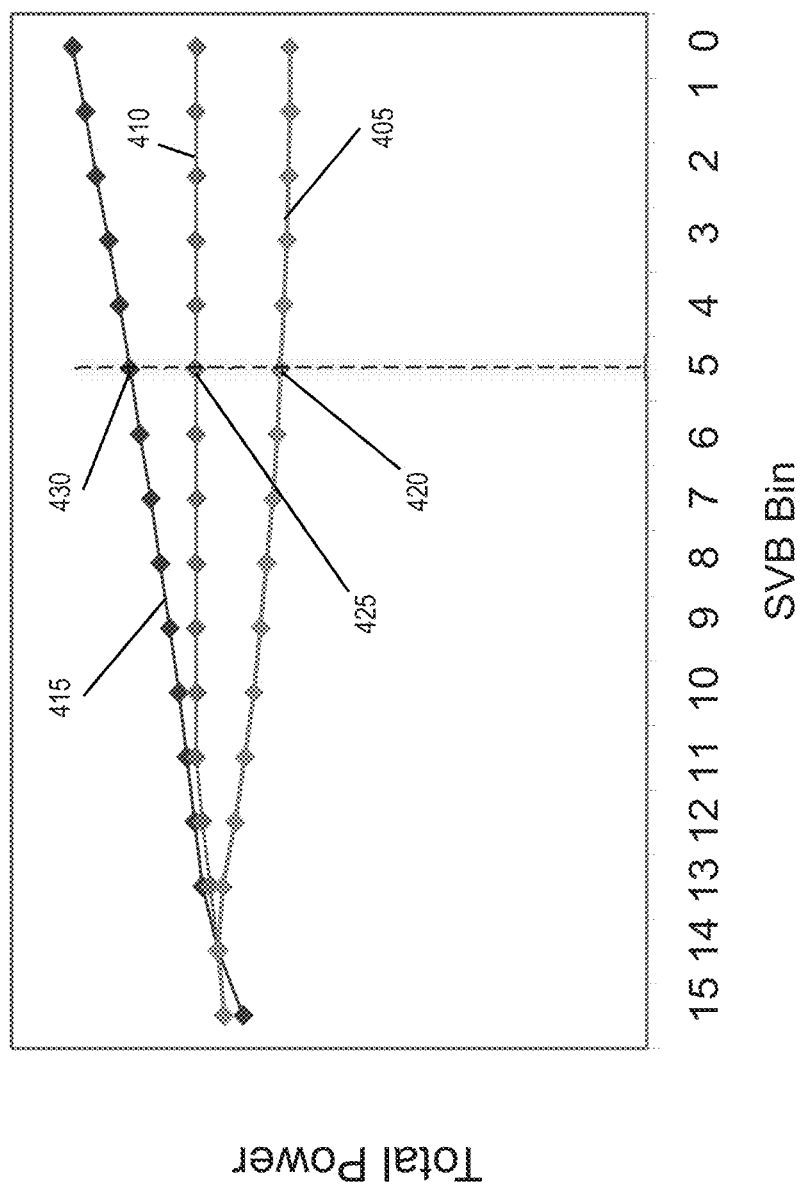
FIG. 4 shows a graph illustrating exemplary power profiles, under device use conditions, for exemplary voltage bins having respective leakage screen values in accordance with aspects of the invention.

FIG. 4 shows a graph illustrating exemplary power profiles for each of the voltage bins 0-15, under device use conditions, in accordance with aspects of the present invention. The voltage bins 0-15 in FIG. 4 may correspond to the voltage bins discussed above with respect to FIG. 3. Line 405 in the graph shows the expected (e.g. median) total power (i.e., dynamic power plus leakage power) for each voltage bin 0-15 under device use conditions (i.e., at each voltage bin's prescribed supply voltage). The expected total power for a particular voltage bin can be predicted by assuming an expected (e.g., median) leakage power.

Line 410 shows the limited total power for each of the voltage bins 0-15, in accordance with aspects of the invention. The limited total power is the highest total power consistent with leakage screen values determined by aspects of the invention (e.g., $305^0$-$305^{15}$ in FIG. 3). For bins with a leakage screen value equal to the second leakage screen value the limited power does not exceed the maximum expected total power. For bins with a leakage screen value equal to the first leakage screen value the limited power approaches the uplift power. The uplift power for a particular voltage bin is determined by uplifting (i.e., increasing) the respective total power of the voltage bin (illustrated by line 405). In particular embodiments, the total power is uplifted by a predetermined factor (e.g., X%, where X is a positive value). For example, the maximum uplift power 425 for voltage bin 5 is determined by increasing the total power 420 for voltage bin 5 by 5%.

Line 415 shows maximum total power, under device use conditions, with a constant leakage screen for bins 0-15, similar to leakage screen value 205 in FIG. 2. As apparent from a comparison of lines 410 and 415, implementation of the invention limits the maximum power consumed by devices assigned to slower voltage bins. This prevents potential failures due to exceeding design constraints. For example, total power with a constant leakage screen in bin 5 (430) exceeds the maximum uplift total power (425).

Figure 5:
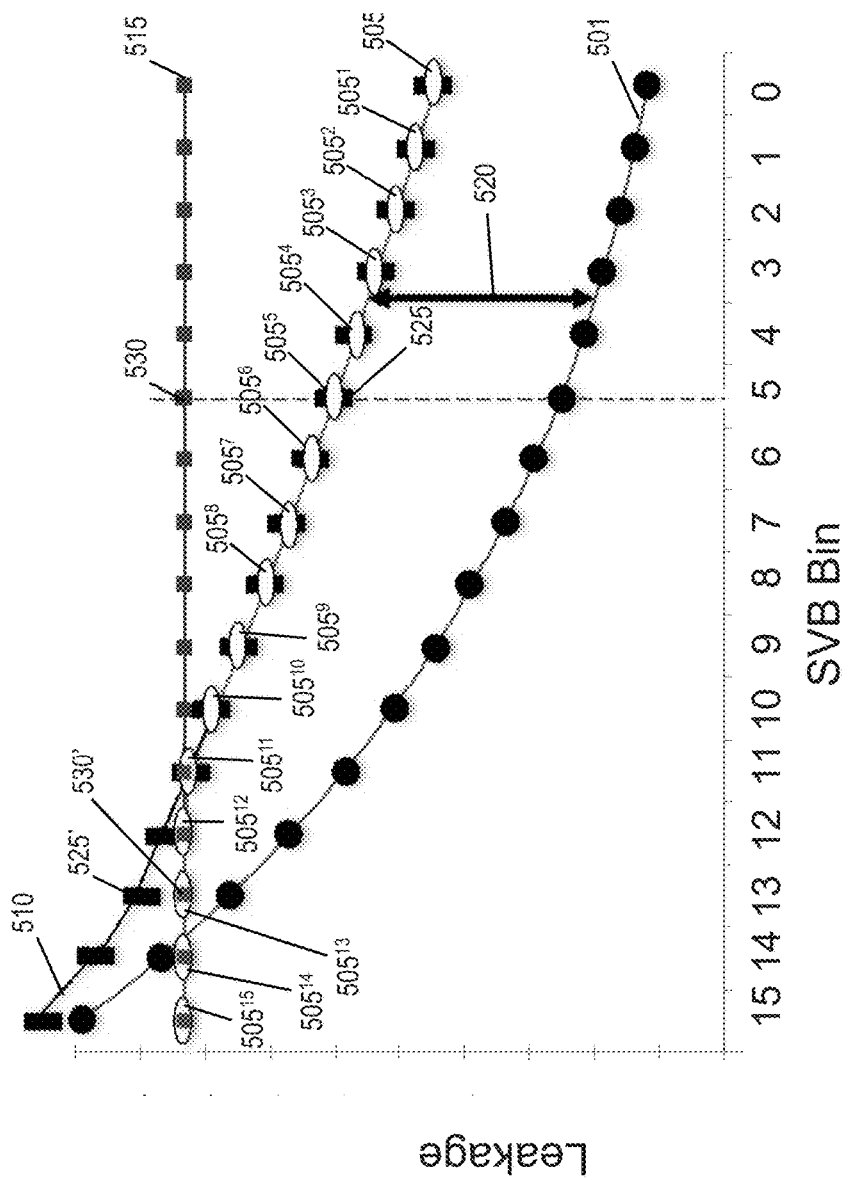
FIG. 5 shows a graph illustrating leakage current, under device test conditions, for exemplary voltage bins having respective leakage screen values in accordance with aspects of the invention.

FIG. 5 shows a graph illustrating leakage current for exemplary voltage bins 0-15, under device test conditions, having respective leakage screen values for each of the voltage bins in accordance with aspects of the invention. Respective leakage screen values $505^0$ to $505^{15}$ establish the maximum leakage current permitted for devices in each of the voltage bins 0-15. Devices that have leakage currents outside the respective leakage screen values $505^0$ to $505^{15}$ may be considered faulty and discarded. Embodiments of the invention are not limited to sixteen voltage bins, and greater or fewer numbers of bins may be implemented instead.

Line 501 illustrates expected (e.g., median) leakage current for devices in bins 0-15 when operated at device test conditions (e.g. fixed temperature and supply voltage). The leakage current 501 corresponds to the expected total power 405 in FIG. 4.

Line 510 illustrates first leakage screen values (e.g., 525 and 525') for the plurality of voltage bins 0-15 in accordance with aspects of the present invention. The first leakage screen values are determined on a per-bin basis, similar to the leakage screen values in FIG. 3 (i.e., leakage screens $305^0$ to $305^{15}$). The first leakage screen value of each voltage bin 0-15 is determined based on the respective uplifted power of each voltage bin. For example, the first leakage screen value 525 for voltage bin 5 can be determined by calculating the total power (i.e. dynamic power and leakage power) of that voltage bin under use conditions and increasing it by a predetermined percentage. The respective first leakage screen value 525 can be determined under test conditions based on a leakage model using the uplifted total power. As illustrated in FIG. 5, the spacing between lines 501 and 510 over the length (i.e., the region between lines 501 and 510) provides a guard band 520 in accordance with aspects of the invention. The guard band 520 represents the difference between: (i) the leakage current of the first leakage screens $505^0$ to $505^{15}$ of each voltage bin 0-15, and (ii) the respective expected leakage current of each voltage bin 0-15 determined based on the expected total power of each voltage bin 0-15

Line 515 illustrates the value of a second leakage screen for the plurality of voltage bins 0-15. The value of the second leakage screen 515 can be determined based on the total power of the expected leakage of fastest performance voltage bin at device use conditions, similar to the leakage screen value 205 in FIG. 2. In embodiments of the invention, the value of the second leakage screen represents the maximum permitted leakage across all of the voltage bins 0-15.

According to aspects of the present invention, the respective leakage screen values $505^0$ to $505^{15}$ are determined for each of the voltage bins 0-15. In embodiments, a particular one of the leakage screen values $505^0$ to $505^{15}$ assigned to a corresponding voltage bin is selected from more than one leakage screen value determined using different processes. The leakage screen value assigned to a particular voltage bin can be selected from the lower of the first leakage screen value of that bin and the second common leakage screen value. In other words, when the first leakage screen value determined for the particular bin is less than the second leakage screen value common to all the voltage bins then the first voltage screen value is selected for that bin (e.g., as shown in FIG. 5 for voltage bins 0-11). Otherwise, the second leakage screen value is selected (e.g., as shown in FIG. 5 for voltage bins 12-15).

For example, where the first leakage screen value 525 of voltage bin 5 is less than the second leakage screen value 530, the first leakage screen value 525 is selected as the respective leakage screen value $505^5$ for voltage bin 5. On the other hand, when the first leakage screen value 525' of voltage bin 13 is greater than the second leakage screen value 530', then the second voltage screen value 530' is selected as the respective leakage screen value $505^{13}$ for voltage bin 13. By assigning respective leakage screen values for each of the plurality of voltage bins, implementations of the present invention reduce total power exposure which may result in failures.

Figure 6:
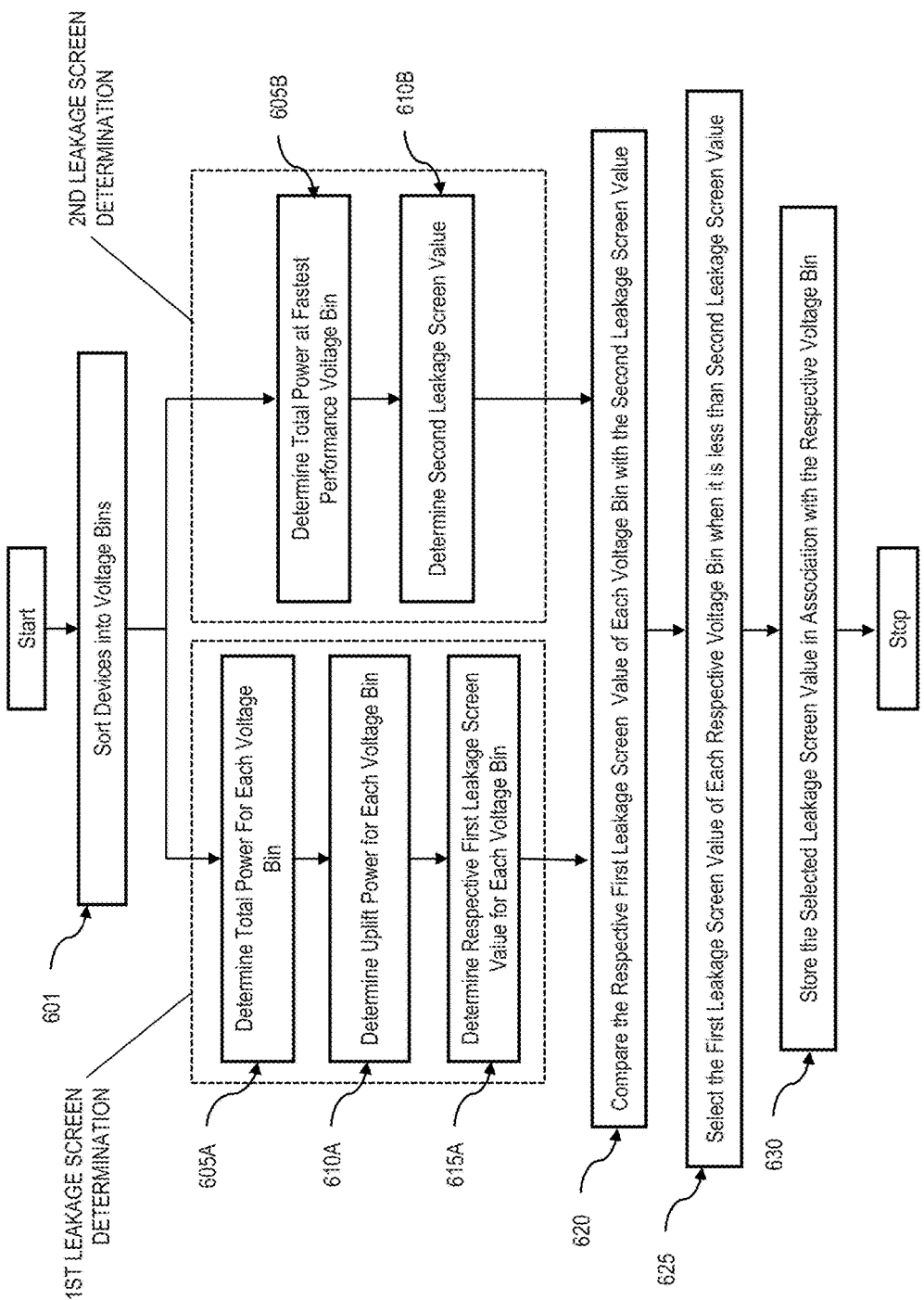
FIG. 6 illustrates an exemplary process for setting leakage screen values in accordance with aspects of the invention.
Figure 7:
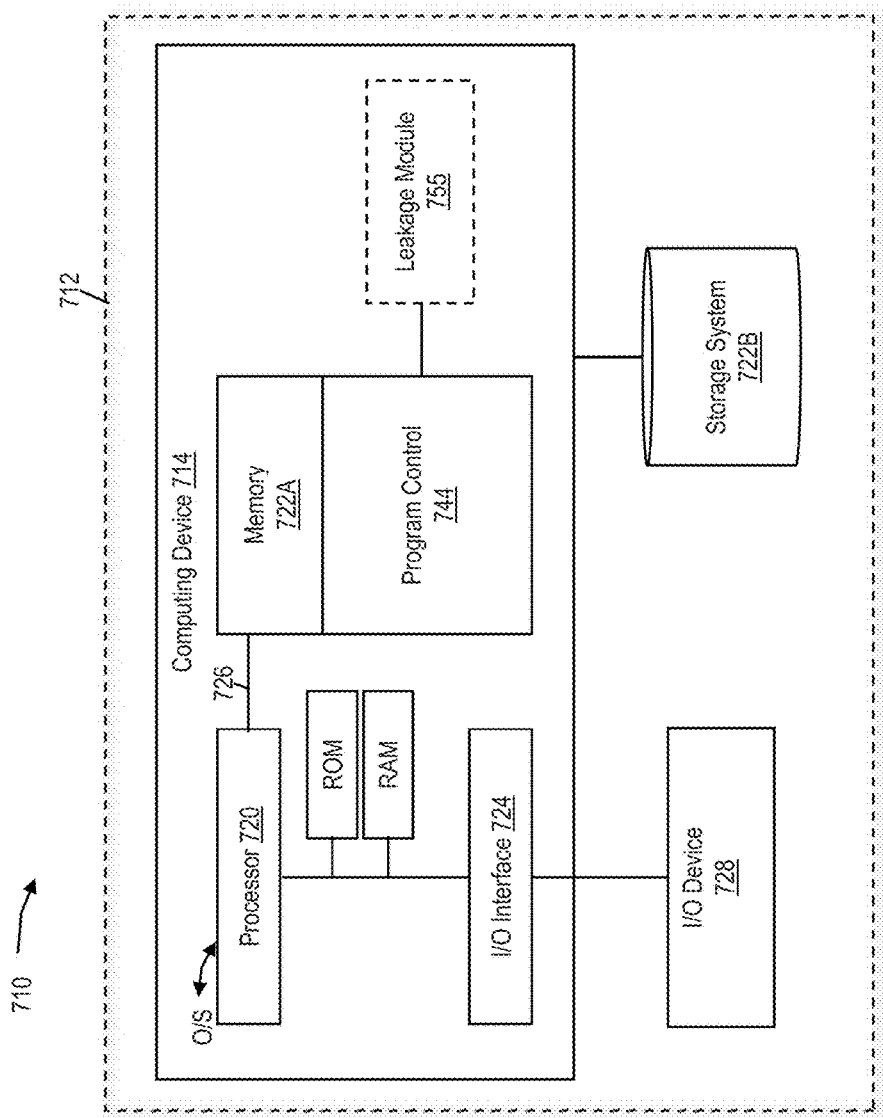
FIG. 7 shows an illustrative environment for implementing the steps in accordance with aspects of the invention.

FIG. 6 shows an exemplary flow for performing aspects of the present invention. The steps of FIG. 6 may be implemented in the environment of FIG. 7, shown below, for example. The flowchart illustrates the operation of possible implementations of systems, methods, and computer program products according to various embodiments of the present invention. In this regard, each block in the flowchart may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Furthermore, the invention can take the form of a computer program product accessible from a computer-usable or computer-readable medium providing program code for use by or in connection with a computer or any instruction execution system. The software and/or computer program product can be implemented in the environments of FIG. 7. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk, and an optical disk. Current examples of optical disks include compact disk-read only memory (CD-ROM), compact disc-read/write (CD-R/W) and DVD.

FIG. 6 depicts an exemplary flow for a process in accordance with aspects of the present invention. At step 601, devices are sorted into voltage bins. In embodiments, the devices (e.g., integrated circuit chips and wafers) are manufactured based on the same device design and are sorted based on their respective performance (e.g., delay). The sorting can be performed, for example, as described above with respect to FIG. 1.

At step 605A, a total power is determined for each voltage bin. In embodiments, the respective total power (including dynamic power and leakage power) is determined based on power consumption using the respective leakage of each voltage bin at device use conditions. FIG. 1, for example, shows exemplary total power determined for each of a plurality of voltage bins.

At step 610A, an uplift power is determined for each voltage bin. Uplift power is determined by increasing the total power of each voltage bin from step 605A by a predetermined proportion. In embodiments, the uplift power of a particular voltage bin is determined by increasing the total power of that voltage bin by a predetermined percentage. For example, the median total power of each voltage bin may be uplifted by a value between 0% and about 10%. The invention, however, is not limited to this range and alternate values for the uplift are contemplated.

At step 615A, a respective first leakage screen value is determined for each voltage bin using the respective uplift power from step 610A. In other words, the first leakage screen value for a particular voltage bin is the leakage current for that voltage bin at the uplift power determined for the voltage bin (e.g., line 510 in FIG. 5). For example, using a leakage model under test conditions, the leakage current for the particular voltage bin is determined based the uplift power for the voltage bin. By determining the leakage current based on the uplifted power, the leakage screen values corresponding to each voltage bin establish a guard band similar to that shown by the guard band 520 in FIG. 5.

In accordance with aspects of the invention, a second leakage screen value is determined for all the voltage bins. The second screen leakage value may be determined, before, after, or in parallel with the determining the first leakage screen value. At step 605B, the total power at the fastest bin is identified. For example, in an embodiment having 16 bins (from the fastest allowed to the slowest allowed device delay), the total power is determined at the fastest allowed voltage bin, similar to voltage bin 110 in FIG. 1.

At step 610B, the second leakage screen value is determined. In embodiments, the second leakage screen value is determined using a leakage model to determine current leakage using the total power from step 605B. For example, the second leakage screen value can be determined as described above with respect to line 515 in FIG. 5. This value represents the maximum leakage value for all the voltage bins. Thus, upon completion of steps 615A and 610B, there is a respective first leakage screen value associated with each one of the plurality of voltage bins 0-15, and a single second leakage screen value that is common to all the voltage bins.

At step 620, for each voltage bin, the respective first leakage screen value from step 615A is compared with the second leakage screen value from step 610B. In embodiments, the value of the first leakage screen for a particular voltage bin is subtracted from the value of the second leakage screen (or vice versa); for example, similar to the comparison of leakage screen values 525 and 530 or leakage screen values 525' and 530' in FIG. 5.

At step 625, for each voltage bin, the respective first leakage screen value is selected when its value is less than the second leakage screen value, e.g., based on the comparing at step 620. That is, similar to the selection of leakage screen values $505^0$ to $505^{15}$ in FIG. 5, when the respective first leakage screen value of a particular voltage bin is less than the maximum leakage screen value determined from fastest performance voltage bin, the respective leakage screen value is selected. Otherwise, if the respective first leakage screen value is greater than the second leakage screen value, the second leakage screen value is selected for that bin. Applying respective leakage screen values to each voltage bin in accordance with the invention ensures that the maximum power for that voltage bin never exceeds the uplift power for that voltage bin. Most devices will have lower power than this screen.

At step 630, the selected leakage screen value is stored in association with its respective voltage bin. For example, the selected leakage screen value for each voltage bin (e.g., from step 625), can be stored in an information storage device. These leakage screen values can then be implemented to screen the devices included in each voltage bin before, for example, the devices are provided to a customer along with information identifying their respective supply voltage requirements corresponding to the respective voltage bins (e.g., as a barcode printed on the packaged device or an ECID recorded into non-volatile memory within the device).

As described above, the process is performed for each voltage bin (e.g., 0-15). In embodiments, the leakage screen selection for each voltage bin can be performed iteratively. That is, steps 620, 625, and 630 are performed for each individual voltage bin in the plurality of bins. For example, at step 620, the first value (e.g., from step 615A) of the first voltage bin is compared to the second value (e.g., from step 610B). Then, steps 625 and 630 are performed for the first voltage bin. If any bins remain, then the process is performed for the next voltage bin starting at step 620.

In embodiments, only the first leakage screen value determination is performed (i.e., steps 605A . . . 615A) without performing the second leakage screen value determination (i.e., steps 605B . . . 610B.). In such embodiments, each voltage bin is associated with its respective first leakage screen value (i.e., step 630). This information can be stored, for example, in a storage system for reference during subsequent device screening operations.

As described above, the first leakage screen value is determined by uplifting the total power for each voltage bin. However, in embodiments the total power is not uplifted and the first screen values are set at the median leakage, such as illustrated by line 501 in FIG. 5.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 7 shows an illustrative environment 710 for managing the processes in accordance with the invention. To this extent, the environment 710 includes a server or other computing system 712 that can perform the processes described herein. In particular, the server 712 includes a computing device 714. The computing device 714 can be resident on a network infrastructure or computing device of a third party service provider (any of which is generally represented in FIG. 1).

The computing device 714 also includes a processor 720, memory 722A, an I/O interface 724, and a bus 726. The memory 722A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 714 is in communication with the external I/O device/resource 728 and the storage system 722B. For example, the I/O device 728 can comprise any device that enables an individual to interact with the computing device 714 (e.g., user interface) or any device that enables the computing device 714 to communicate with one or more other computing devices using any type of communications link. The external I/O device/resource 728 may be for example, a handheld device, PDA, handset, keyboard etc.

In general, the processor 720 executes computer program code (e.g., program control 744), which can be stored in the memory 722A and/or storage system 722B. Moreover, in accordance with aspects of the invention, the program control 744 controls a leakage module 755, e.g., the processes described herein. The leakage module 755 can be implemented as one or more program code in the program control 744 stored in memory 722A as separate or combined modules. Additionally, the leakage module 755 may be implemented as separate dedicated processors or a single or several processors to provide the function of these tools. While executing the computer program code, the processor 720 can read and/or write data to/from memory 722A, storage system 722B, and/or I/O interface 724. The program code executes the processes of the invention. The bus 726 provides a communications link between each of the components in the computing device 714.

The computing device 714 can comprise any general purpose computing article of manufacture capable of executing computer program code installed thereon (e.g., a personal computer, server, etc.). However, it is understood that the computing device 714 is only representative of various possible equivalent-computing devices that may perform the processes described herein. To this extent, in embodiments, the functionality provided by the computing device 714 can be implemented by a computing article of manufacture that includes any combination of general and/or specific purpose hardware and/or computer program code. In each embodiment, the program code and hardware can be created using standard programming and engineering techniques, respectively.

Similarly, the computing infrastructure 712 is only illustrative of various types of computer infrastructures for implementing the invention. For example, in embodiments, the server 712 comprises two or more computing devices (e.g., a server cluster) that communicate over any type of communications link, such as a network, a shared memory, or the like, to perform the process described herein. Further, while performing the processes described herein, one or more computing devices on the server 712 can communicate with one or more other computing devices external to the server 712 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or technical improvement over technologies found in the marketplace, or to enable others of ordinary skill in the art to understand the embodiments disclosed herein.

What is claimed is:

1. A method for performing leakage screening, comprising:
    sorting, using a computer program product implemented on a computing device, a plurality of chip devices manufactured from the same device design into a plurality of voltage bins corresponding to a respective supply voltage that improves performance of each chip device;
    determining through a leakage module implemented on the computing device a respective first leakage screen value based on a respective first leakage current by uplifting an expected total power of each voltage bin by a predetermined proportion under device test conditions for each of a plurality of voltage bins;
    determining through the leakage module implemented on the computing device a second leakage screen value based on a respective second leakage current, under device test conditions, of a fastest performance voltage bin of the plurality of voltage bins;
    selecting one of the respective first leakage screen value and the second leakage screen value for each of the plurality of voltage bins; and
    limiting a power exposure by discarding chip devices having a leakage screen value that exceed a fixed leakage screen value but still fall below the first leakage screen value to further constrain a respective total power of each of the plurality of voltage bins under device test conditions.

2. The method of claim 1, wherein the determining the respective first leakage screen value for each of a plurality of voltage bins comprises:
    determining a respective total power for each of the plurality of voltage bins;
    determining a respective uplift power for each of the plurality of voltage bins based on the respective total power of each of the plurality of voltage bins; and
    determining the respective first leakage screen value for each of the plurality of voltage bins based on the respective uplift power of each of the plurality of voltage bins.

3. The method of claim 2, wherein the respective total power for each of the plurality voltage bins is based on the respective supply voltage corresponding to each of the plurality of voltage bins.

4. The method of claim 2, wherein:
the determining the respective uplift power comprises increasing the respective total power by a predetermined proportion of 5% so that the total power consumed under device use conditions by devices assigned a particular voltage bin does not exceed the uplift power for the particular voltage bin which equals 105% of the expected total power and the respective total power is further limited by the second leakage screen value for the fastest performance voltage bin of the plurality of voltage bins; and
the voltage bins having the first leakage screen value equal to the second leakage screen value have a limited power that does not exceed a maximum expected total power.

5. The method of claim 2, wherein the determining the respective first leakage screen value of each of the plurality of voltage bins comprises determining a maximum leakage current for each of the voltage bins based on the respective uplift power of each of the plurality of voltage bins.

6. The method of claim 1, wherein the selecting comprises:
comparing the first leakage screen value of each of the plurality of voltage bins with the second leakage screen value; and
selecting, for each of the plurality of voltage bins, the respective first leakage screen value of each of the plurality of voltage bins when the respective first leakage screen value of each of the plurality of voltage bins is less than second leakage screen value.

7. The method of claim 6, further comprising, for each of the plurality of voltage bins, storing in an information storage device the selected leakage screen value in association with the respective one of the plurality of voltage bins.

8. The method of claim 1, wherein the respective first leakage screen value of each of the plurality of voltage bins provides a guard band over a respective expected leakage current of each of the plurality of voltage bins.

9. The method of claim 1, wherein the determining the second leakage screen value comprises:
determining total power at a fastest performance voltage bin of the plurality of voltage bins; and
determining a leakage current of the fastest performance voltage bin based on the total power of the fastest performance voltage bin.

10. The method of claim 1, wherein the second leakage screen value is a maximum leakage screen value for all the plurality voltage bins.

11. A method comprising:
sorting, using a computer program product implemented on a computing device, a plurality of integrated circuit devices manufactured from the same device design into a plurality of voltage bins corresponding to a respective supply voltage that improves performance of each integrated circuit device;
determining, using the computer program product implemented on the computing device, a respective total power of each of the plurality of voltage bins under device test conditions which include a fixed temperature and a supply voltage, the respective total power of each voltage bin is a combination of a dynamic power and a leakage power when operated at the respective supply voltage of the voltage bin;
determining, using the computer program product implemented on the computing device, a respective uplift power representing an increase in the respective total power of each of the plurality of voltage bins under device test conditions that include the fixed temperature and the supply voltage;
determining through a leakage module implemented on the computing device a respective first leakage screen value based on uplifting an expected total power of each voltage bin by a predetermined proportion for each of the plurality of voltage bins based on the respective uplift power of each of the plurality of voltage bins under device test conditions;
determining a respective leakage current in each voltage bin under device test conditions for each of the plurality of voltage bins based on a device delay of each integrated circuit device within each of the plurality of voltage bins; and
limiting a power exposure by discarding integrated circuit devices having a leakage screen value that exceed a fixed leakage screen value but still fall below the respective first leakage screen value to further constrain the respective total power.

12. The method of claim 11, wherein the determining the respective uplift power of each of the plurality of voltage bins comprises increasing the respective total power of each of the plurality of voltage bins by a predetermined proportion.

13. The method of claim 11, wherein the respective first leakage screen value of each of the plurality of voltage bins provides a guard band over a respective expected leakage current of each of the plurality of voltage bins.

14. The method of claim 11, further comprising determining a maximum leakage screen value that is common to all of the plurality of voltage bins, wherein the maximum leakage screen value is based on a total power at an expected leakage current of a fastest performance voltage bin at device use conditions.

15. The method of claim 14, further comprising:
comparing the respective first leakage screen value of each of the plurality of voltage bins with the maximum leakage screen value;
selecting, for each of the plurality of voltage bins, one of the respective first leakage screen value and the maximum leakage screen value based on the comparing; and
associating, for each one of the plurality of voltage bins, the selected leakage screen value with the respective one of the plurality of voltage bins.

16. The method of claim 14, wherein the determining a maximum leakage screen value comprises:
determining a total power of a fastest performance voltage bin of the plurality of voltage bins; and
determining a maximum leakage current of the fastest performance voltage bin using the total power of the fastest performance voltage bin.

17. A computer program product implemented on a computing device comprising a non-transitory computer readable storage medium having readable program code embodied in the storage medium, the computer program product includes at least one component configured to:
determine through a leakage module implemented on the computing device a respective first leakage screen value based on uplifting an expected total power of each voltage bin by a predetermined proportion and determining a respective leakage current in each voltage bin under device test conditions for each of a plurality of voltage bins, each voltage bin corresponding to a respective supply voltage that improves performance and power consumption of an integrated circuit chip device contained within each voltage bin, said first leakage screen value providing a guard band with respect to a respective expected leakage current of the plurality of voltage bins;

determine through the leakage module implemented on the computing device a second leakage screen value based on the respective leakage current, under device test conditions, of a fastest performance voltage bin of the plurality of bins;

select one of the respective first leakage screen value and the second leakage screen value for each of the plurality of voltage bins; and limiting a power exposure by discarding integrated circuit chip devices having a leakage screen value that exceed a fixed leakage screen value but still fall below the first leakage screen value to further constrain a respective total power of each of the plurality of voltage bins under device test conditions.

18. The computer program product of claim 17, wherein the at least one component is configured to:
   determine the respective total power of each of a plurality of voltage bins;
   determine a respective uplift power of each of the plurality of voltage bins by increasing the respective total power of each of the plurality of voltage bins by a predetermined proportion;
   determine a respective first leakage screen value for each of the plurality of bins based on the respective uplift power of each of the plurality of voltage bins.

19. The computer program product of claim 17, wherein the at least one component is configured to:
   determine a total power at the fastest performance process voltage bin; and
   determine a leakage current at the total power at the fastest performance process voltage bin.

20. The computer program product of claim 17, wherein the second leakage screen value is a maximum leakage screen value.

* * * * *